(12) United States Patent
Miura et al.

(10) Patent No.: US 6,294,019 B1
(45) Date of Patent: Sep. 25, 2001

(54) METHOD OF MAKING GROUP III-V COMPOUND SEMICONDUCTOR WAFER

(75) Inventors: Yoshiki Miura; Toshiyuki Morimoto, both of Itami (JP)

(73) Assignee: Sumitomo Electric Industries, Ltd., Osaka (JP)

(*) Notice: Subject to any disclaimer, the term of this patent is extended or adjusted under 35 U.S.C. 154(b) by 0 days.

(21) Appl. No.: 09/588,847

(22) Filed: Jun. 6, 2000

Related U.S. Application Data

(62) Division of application No. 09/065,392, filed on Apr. 23, 1998, now abandoned.

(30) Foreign Application Priority Data

May 22, 1997 (JP) .................................................. 9-132033

(51) Int. Cl.⁷ .................................................. C30B 25/18
(52) U.S. Cl. .................. 117/96; 117/97; 117/955; 438/690; 438/701
(58) Field of Search .................. 117/96, 97, 955; 438/690, 701

(56) References Cited

U.S. PATENT DOCUMENTS

| | | |
|---|---|---|
| 4,054,010 | 10/1977 | Shipman . |
| 4,768,071 * | 8/1988 | Etienne et al. ................. 357/22 |
| 4,925,809 * | 5/1990 | Yoshiharu et al. ............. 437/95 |
| 5,225,235 * | 7/1993 | Yoshiharu et al. ............. 428/84 |
| 5,426,073 | 6/1995 | Imaoka et al. . |
| 5,439,723 * | 8/1995 | Miyashita et al. ............ 428/131 |
| 5,532,173 | 7/1996 | Martin et al. . |
| 5,608,255 | 3/1997 | Martin et al. . |
| 5,751,055 | 5/1998 | Maruyama et al. . |
| 5,989,985 * | 11/1999 | Maruyama et al. ............ 438/507 |

FOREIGN PATENT DOCUMENTS

| | | | |
|---|---|---|---|
| 4033683 | 6/1991 | (DE) . | |
| 0416128 | 3/1991 | (EP) . | |
| 54-025185 | 2/1979 | (JP) . | |
| 58-103144 | 7/1983 | (JP) . | |
| 03177023 | 8/1991 | (JP) . | |
| 05-160052 | 6/1993 | (JP) . | |
| 06-061201 | 3/1994 | (JP) . | |
| 06232057 | 8/1994 | (JP) . | |
| 6-232057 * | 8/1994 | (JP) ........................... 117/89 |
| 08162420 | 6/1996 | (JP) . | |

* cited by examiner

*Primary Examiner*—Robert Kunemund
(74) *Attorney, Agent, or Firm*—W. F. Fasse; W. G. Fasse

(57) ABSTRACT

In the present method, a group III-V compound semiconductor wafer includes a substrate consisting of a group III-V compound whose outer peripheral edge portion is so chamfered that its section has an arcuate shape substantially with a radius R, and an epitaxial layer consisting of a group III-V compound layer formed on the substrate. A portion of the wafer is removed at the outer peripheral edge thereof, up to a distance L from the original peripheral edge, and the distance L satisfies the expression R≦L≦3L. thereby an abnormally grown part of the epitaxial layer is reliably removed.

16 Claims, 5 Drawing Sheets

METHOD OF MAKING GROUP III-V COMPOUND SEMICONDUCTOR WAFER

CROSS-REFERENCE TO RELATED APPLICATION

This application is a Divisional of our prior U.S. application Ser. No. 09/065,392, filed Apr. 23, 1998 now adondoned.

BACKGROUND OF THE INVENTION

1. Field of the Invention

The present invention relates to a method of making a group III-V compound semiconductor wafer, and more particularly, it relates to a method of making a group III-V compound semiconductor wafer having an epitaxial layer grown by vapor-phase epitaxy.

2. Description of the Prior Art

The recent development of optical communication has caused an increase in the production quantity of photodiodes and the like. For example, an InP photodiode (hereinafter referred to as a pin-PD) is prepared by growing an epitaxial layer on an indium-phosphorus (hereinafter referred to as (InP) substrate by chloride vapor-phase epitaxy.

In order to prepare a pin-PD, an InP substrate is formed by cutting an InP ingot into slices and chamfering and grinding and polishing each slice. Then, a group III-V compound layer is epitaxially grown on this substrate for preparing an InP wafer, and thereafter a Zn diffusion layer, a protective film and the like are formed on this InP wafer. While the InP wafer grown into a diameter of two inches is generally cut into a rectangular form and thereafter subjected to a device process of forming the Zn diffusion layer and the like, such a wafer has recently been subjected to the device process in the circular shape of 2 inches in diameter as such, in order to reduce the cost.

An end portion of the InP wafer, which is generally picked up and carried with tweezers or held by a conveying machine, may be chipped or cracked in the device process. In order to prevent this, the end portion of the substrate is generally chamfered. For example, Japanese Utility Model Laying-Open No. 58-103144 (1983) describes a technique of forming a prescribed chamfered part on an end portion of a GaAs substrate for preventing flaws in mirror grinding or chipping in step movement.

On the other hand, Japanese Patent Laying-Open No. 6-61201 (1994) discloses a technique of forming a prescribed chamfered part on an end portion of a silicon substrate for preventing occurrence of edge crowns.

When a wafer prepared by growing an epitaxial layer on an InP substrate provided with a chamfered portion is subjected to a device process, however, the wafer is disadvantageously cracked in a diffusion step for impurity introduction, a thermal CVD step for forming a protective film or an ultrasonic cleaning step for removing foreign matter.

SUMMARY OF THE INVENTION

Accordingly, the present invention has been proposed for solving such a problem, and an object thereof is to provide a method of making a group III-V compound semiconductor wafer which is hardly cracked in a device process.

A group III-V compound semiconductor wafer prepared ac-cording to an aspect of the present invention comprises a semiconductor substrate consisting of a group III-V compound and a group III-V compound layer formed on this semiconductor substrate. An epitaxial abnormal grown part is removed from the outer peripheral edge portion of the group III-V compound semiconductor wafer. The epitaxial abnormal grown part is a part of the group III-V compound layer having a relatively large thickness.

A portion of the group III-V compound semiconductor wafer is removed up to a location separated from the original outer peripheral edge part by a distance L. The distance L is the length of the stock amount.

Further, the surface roughness Rmax of the outer peripheral edge of the group III-V compound semiconductor wafer formed by removing the abnormal grown part is preferably not more than $2/\mu m$.

The group III-V compound layer is preferably formed to have a (100) plane as a plane substantially parallel to the major surface of the substrate. "Substantially parallel" means that the (100) plane forms an angle of not more than, 16 degrees with the major surface of the semiconductor substrate.

Before the epitaxial layer is formed, the semiconductor substrate consisting of a group III-V compound is chamfered in such a manner that an outer peripheral edge portion thereof has a sectional shape with an arcuate shape substantially having a radius R. The distance L satisfies an expression $R \leq L \leq 3R$.

The semiconductor substrate is preferably exposed on a portion at a distance up to 0.1 mm from the outer peripheral edge of the group III-V compound semiconductor wafer.

The outer peripheral edge of the group III-V compound semiconductor wafer is preferably so chamfered when removing the abnormal grown part, so that its section has an arcuate shape substantially with a radius r, which is preferably at least 0.1 mm.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In order to prevent a wafer from cracking in the aforementioned device process, the inventors have first studied the cause for the cracking. Consequently, they have found that an epitaxial layer is grown at an abnormally high speed in a specific plane orientation part of the periphery of the wafer prepared by growing an InGaAs epitaxial layer on an InP substrate, to remarkably crack the wafer particularly in this part.

Figure 1:
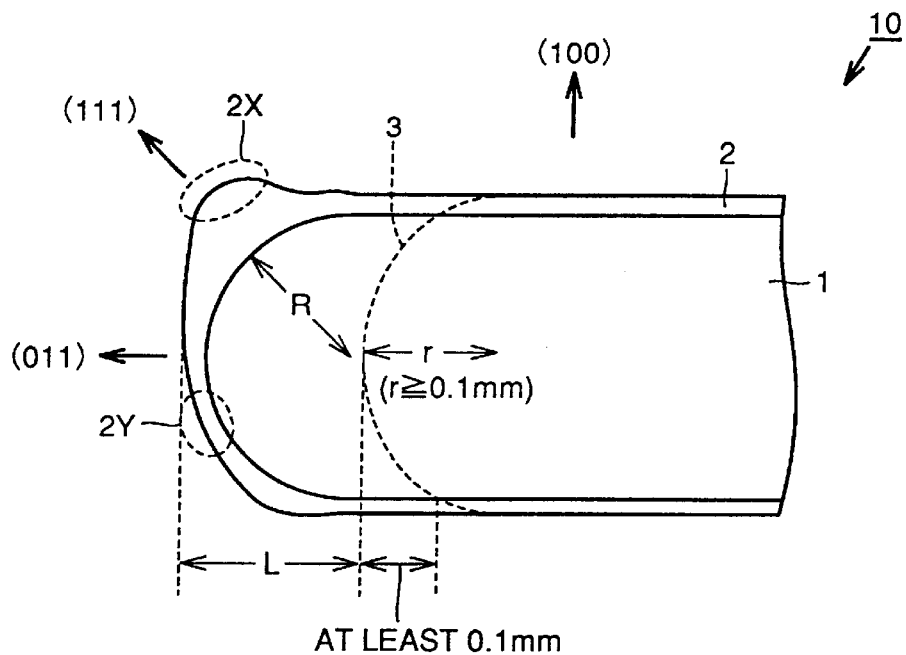
FIG. 1 is a sectional view showing an abnormal grown epitaxial layer.

Referring to FIG. 1, an InGaAs epitaxial layer 2 is formed on a surface of an InP substrate 1 as a group III-V compound layer. Arrows (100), (111) and (011) denote (100), (111) and (011) planes of the InP substrate 1 respectively. The outer peripheral edge portion of the InP substrate 1 has an arcuate shape with a radius R. A part 2X of the InGaAs epitaxial layer 2 has a large thickness due to abnormal high-speed growth. Another part 2Y of the InGaAs epitaxial layer 2 has a small thickness to the contrary. It has been recognized that, when a wafer having the epitaxial layer 2 which is partially varied in thickness is subjected to a device process, remarkable stress is caused in a heat cycle of the device process since the thermal expansion coefficients of the InP substrate 1 and the InGaAs epitaxial layer 2 are extremely different from each other, to result in cracking of the part 2X having a large thickness. Also as an inherent feature of the two different group III-V materials of the substrate 1 and of the layer 2, there is a lattice mismatch between these two materials, especially at the abnormally grown part 2X, which contributes to the tendency of cracking of the part 2X in a heat cycle.

According to the present invention, an end portion of the wafer causing abnormal growth in the vicinity of the (111) plane is removed up to a position shown by a dotted line 3 after the epitaxy, thereby eliminating the abnormal grown part. Thus, it is possible to obtain a group III-V compound semiconductor wafer 10 which is hardly cracked in the device process.

The inventors have made various experiments, to find that the wafer 10 having an outer peripheral edge portion which is so chamfered that the section of the substrate 1 has an arcuate shape substantially with a radius R readily causes an abnormal grown part in a portion at a distance of 0 to R from the outer peripheral edge in particular. If at least the portion at the distance R from the edge of the wafer 10 is removed, therefore, the abnormal grown part is eliminated. On the other hand, the amount L of removal is preferably minimized since the InP substrate 1 can be more effectively utilized as the amount L of removal is reduced. In the current equipment, however, the positioning accuracy is substantially equal to the radius R (=0.25 mm) of substrates generally employed at present, and hence the amount L of removal is dispersed in the range of ±R. When the upper limit of the amount L of removal is set at 3R, therefore, the portion at the distance R from the edge of the wafer 10 can be removed in the worst case.

It is preferable that the InGaAs epitaxial layer 2 serving as the group III-V compound layer is formed to have the (100) plane as a plane substantially parallel to the major surface of the InP substrate 1, so that the abnormal grown part 2X is located on the (111) plane to satisfy the aforementioned condition.

It is further preferable that the surface roughness Rmax of the outer peripheral edge of the group III-V compound semiconductor wafer 10 obtained by removing the aforementioned portion is not more than 2 $\mu$m, so that no starting point is present to cause cracking of the wafer 10.

As shown in FIG. 1, the epitaxial abnormal grown part 2X is removed from the outer peripheral edge portion of the group III-V compound semiconductor wafer 10 according to the present invention, whereby the wafer 10 is hardly cracked in the device process.

It has been recognized that the wafer 10 is hardly cracked in the device process if the InP substrate 1 is exposed on a portion at a distance up to 0.1 mm from the outer peripheral edge of the wafer 10.

It is preferable that the outer peripheral edge portion of the wafer 10 is so chamfered that its section has an arcuate shape substantially with a radius r, which is at least 0.1 mm. The radius r is set to be at least 0.1 mm since there is no chamfering grindstone having a chamfering radius of less than 0.1 mm at present. Even if a grindstone having a chamfering radius of less than 0.1 mm is developed, its working accuracy is so insufficient that the working surface is inferior in flatness since the grain size of diamond forming the grindstone is about 0.05 $\mu$m. Even if the outer peripheral edge portion of the wafer 10 is so chamfered that the radius r is less than 0.1 mm, further, an end portion of the wafer 10 is readily cracked during grinding of the wafer 10 or in the device process due to its sharpness.

EXAMPLE

Figure 2A:
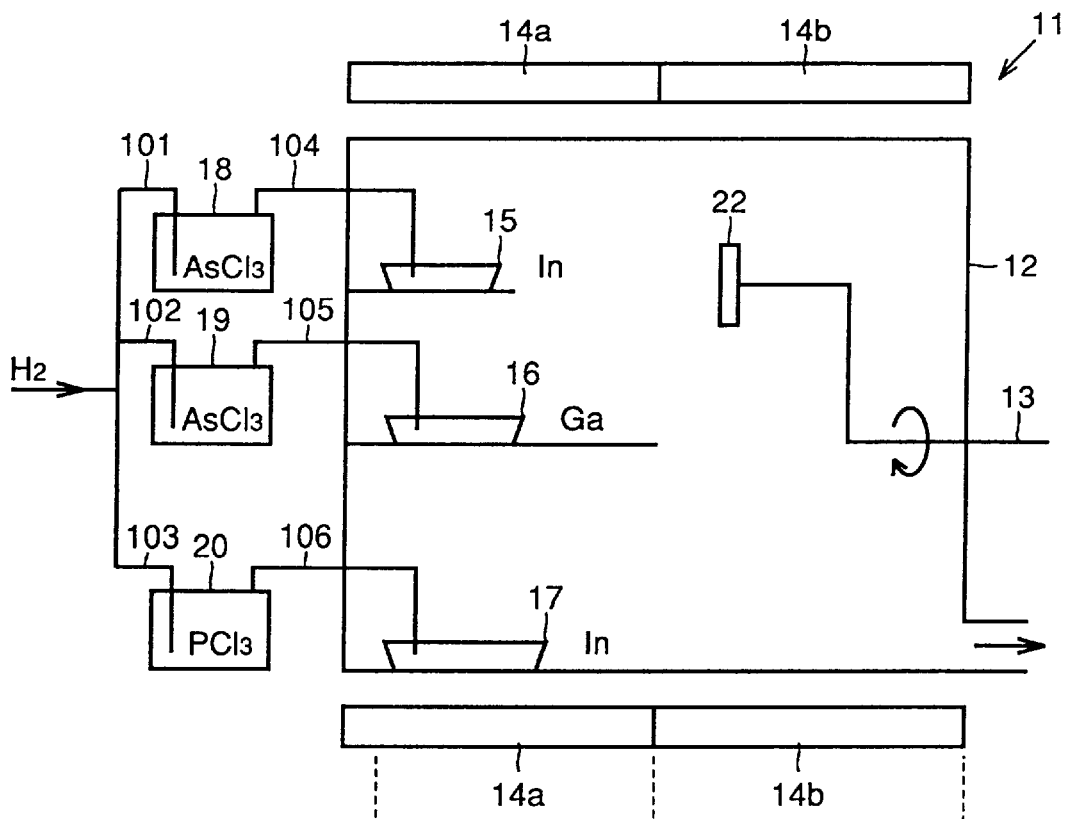
FIG. 2A is a model diagram showing a vapor-phase epitaxy apparatus.

Example of the present invention is now described with reference to the drawings. Referring to FIG. 2A, a vapor-phase epitaxy apparatus 11 comprises a reactor 12, driving means 13, heaters 14a and 14b, source boards 15, 16 and 17, and source containers 18, 19 and 20. The source boards 15 and 17 containing indium (In) and the source board 16 containing gallium (Ga) are provided in the reactor 12. The driving means 13 is adapted to rotate a substrate 22 along the illustrated arrow. Hydrogen is fed into the source containers 18 and 19 containing AsCl$_3$ and the source container 20 containing PCl$_3$ through pipes 101 to 103 respectively. The source containers 18, 19 and 20 are connected with the source boards 15, 16 and 17 through pipes 104 to 106 respectively. The heaters 14a and 14b heat the reactor 12.

Figure 3:
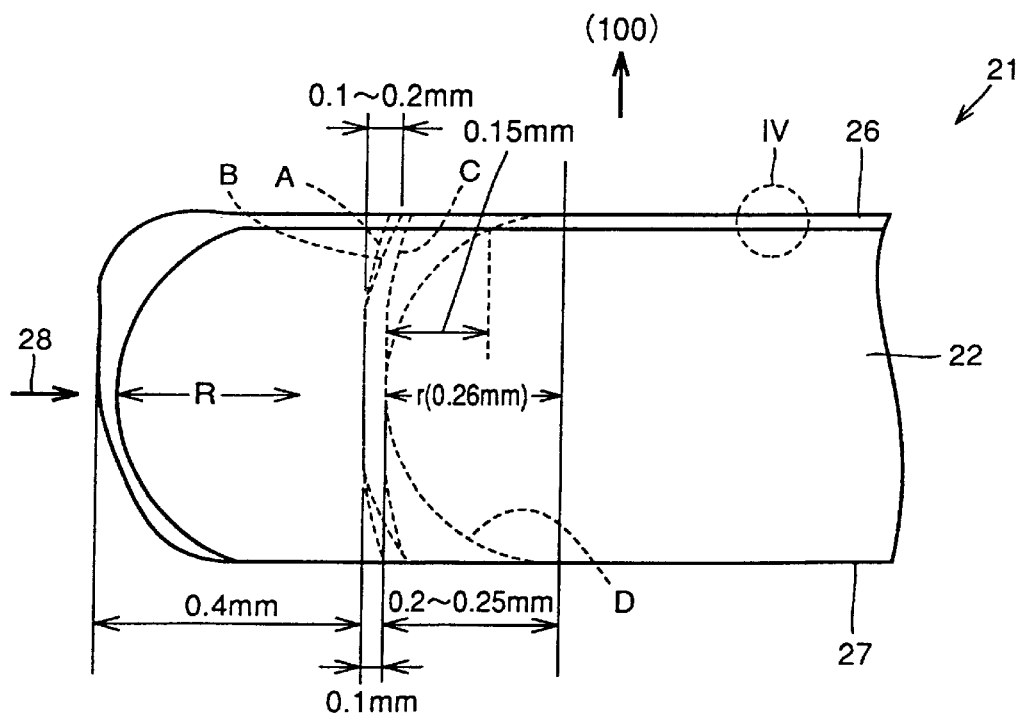
FIG. 3 is a sectional view showing a ground wafer.
Figure 2B:
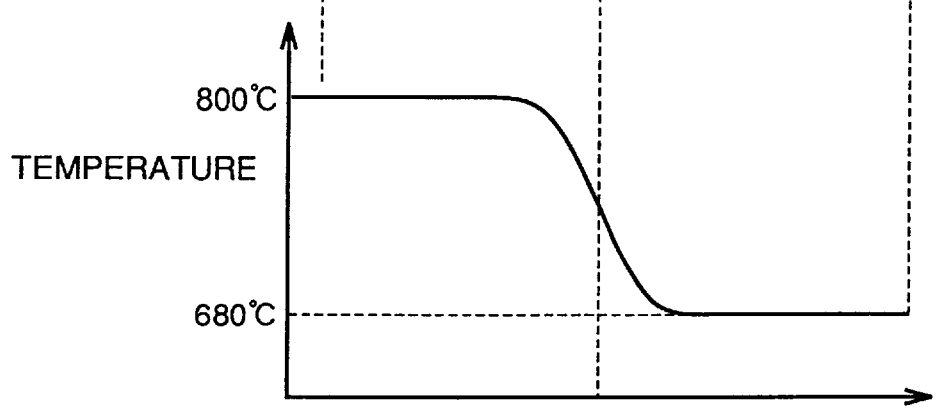
FIG. 2B illustrates temperature distribution in a reactor.

With such an apparatus 11, outputs of the heaters 14a and 14b were first adjusted to form the temperature distribution shown in FIG. 2B in the reactor 12. Then, the substrate 22 consisting of InP doped with sulfur was set on the driving means 13. This substrate 22 was 51 mm in diameter and 450 $\mu$m in thickness. Further, the radius R of this substrate 22 was 0.25 mm on its end or peripheral edge section, as shown in FIG. 3. The driving means 13 rotated and moved the substrate 22 downward in FIG. 2A. Hydrogen gas was fed into the source container 20 through the pipe 103 in this state, to cause the following chemical reaction (1) in the reactor 12 and particularly in the source container 20:

$$PCl_3 + \frac{3}{2}H_2 \rightarrow \frac{1}{4}P_4 + 3HCl \qquad (1)$$

P$_4$ and HCl resulting from the aforementioned reaction (1) were fed into the source board 17, to cause the following chemical reaction (2):

$$In + HCl \rightarrow InCl + \frac{1}{2}H_2 \qquad (2)$$

P$_4$ fed into the source board 17 and InCl and H$_2$ resulting from the aforementioned reaction (2) caused the following chemical reaction (3) on the substrate 22:

$$InCl + \frac{1}{4}P_4 + \frac{1}{2}H_2 \rightarrow InP + HCl \qquad (3)$$

Figure 4:
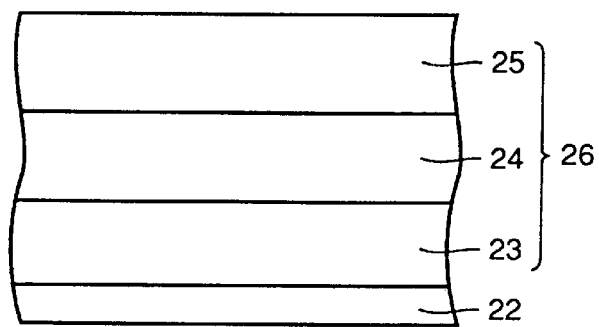
FIG. 4 is an enlarged sectional view of a part IV appearing in FIG. 3.

From the formula (3), an InP buffer layer 23 of about 2 μm in thickness was grown on the substrate 22 as shown in FIG. 4.

Then, the driving means 13 rotated and moved the substrate 22 upward in FIG. 2A and hydrogen gas was fed into the source containers 18 and 19 through the pipes 101 and 102, thereby causing the following reaction (4) in the reactor 12 and particularly in the source containers 18 and 19:

$$AsCl_3 + \frac{3}{2}H_2 \rightarrow \frac{1}{4}As_4 + 3HCl \qquad (4)$$

$As_4$ and HCl resulting from the aforementioned reaction (4) were fed into the source board 15 through the pipe 104, to cause the following chemical reaction (5):

$$In + HCl \rightarrow InCl + \tfrac{1}{2}H_2 \qquad (5)$$

Further, $As_4$ and HCl resulting from the aforementioned reaction (4) were fed into the source board 16 through the pipe 105, to cause the following chemical reaction (6):

$$Ga + HCl \rightarrow GaCl + \tfrac{1}{2}H_2 \qquad (6)$$

$As_4$ fed into the source board 15, InCl generated in the source board 15, GaCl generated in the source board 16 and $H_2$ generated in the source boards 15 and 16 caused the following chemical reaction (7):

$$InCl + GaCl + \tfrac{1}{4}As_4 + H_2 \rightarrow InGaAs + 2HCl \qquad (7)$$

From the formula (7), an InGaAs photoreceiving layer 24 of 3μm in thickness was formed on the substrate 22 as shown in FIG. 4.

The driving means 13 moved the substrate 22 downward in FIG. 2A and hydrogen gas was fed into the source container 20, thereby forming an InP window layer 25 of about 1.5 μm in thickness on the substrate 22 as shown in FIG. 4. Thus, a wafer 21 provided with an epitaxial layer 26 as a group III-V compound layer was formed on the substrate 22 by chloride VPE as shown in FIG. 3.

Figure 5:
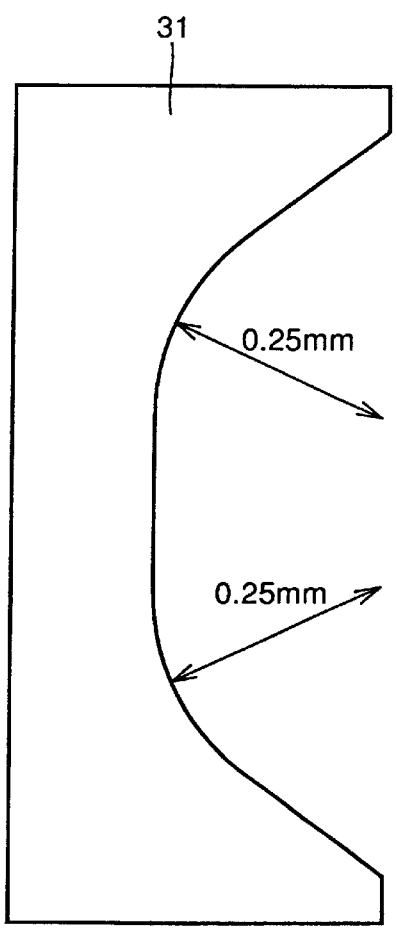
FIG. 5 is a sectional view of a grindstone employed for grinding an end surface of a wafer.
Figure 6:
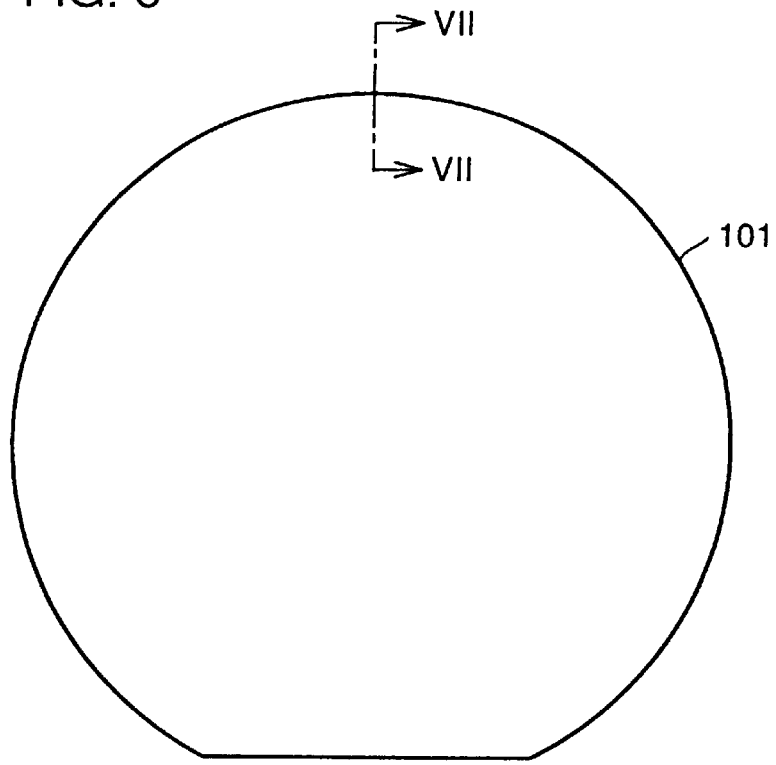
FIG. 6 is a plan view of a wafer obtained in accordance with the present invention.

Then, the wafer 21 was taken out from the reactor 12, for vacuum-sucking and holding a back surface 27 of the wafer 21 provided with no epitaxial layer 26. A diamond grindstone of #800 (Japanese Industrial Standards) in grain size and 0.25 mm in arc radius shown in FIG. 5 was brought into contact with the wafer 21 along arrow 28 in FIG. 3, for removing a Dortion at a distance of 0.4 mm from the edge of the raw wafer 21, i.e., the portion up to A in FIG. 3. In order to reduce a load in finish working and completely eliminate an abnormal grown part, a portion at a distance of at least 0.1 mm and not more than 0.2 mm from the edge of the wafer 21 was chamfered for bringing the edge into a shape denoted by B.

Then, a portion at a distance of 0.1 mm from the edge of the wafer 21 was removed with a diamond grindstone of #2000 (Japanese Industrial Standards) in grain size and 0.25 mm in arc radius, for bringing the edge of the wafer 21 into a shape denoted by C. Further, a portion at a distance of 0.2 to 0.25 mm from the edge of the wafer 21 was chamfered for bringing the edge of the wafer 21 into a shape denoted by D. Thus, the inventive wafer 21 was completed with surface roughness Rmax of not more than 2.0 μm on its end surface and a diameter of 50 mm. When the wafer 21 prepared in the aforementioned manner was subjected to a device process, the cracking ratio was reduced to about ⅕ as compared with the prior art.

Figure 7:
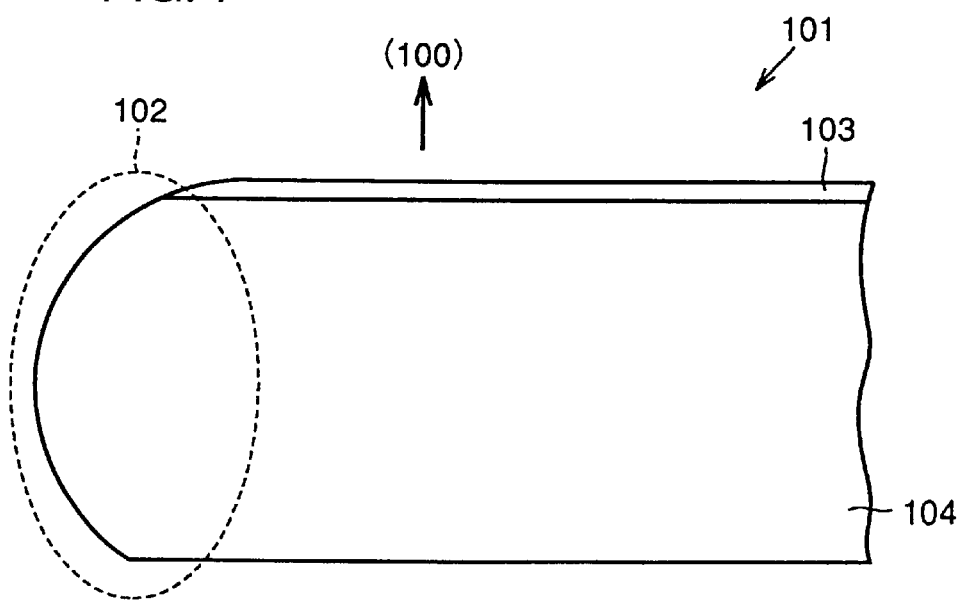
FIG. 7 is a cleavage sectional view taken along the line VII—VII in FIG. 6.
Figure 8:
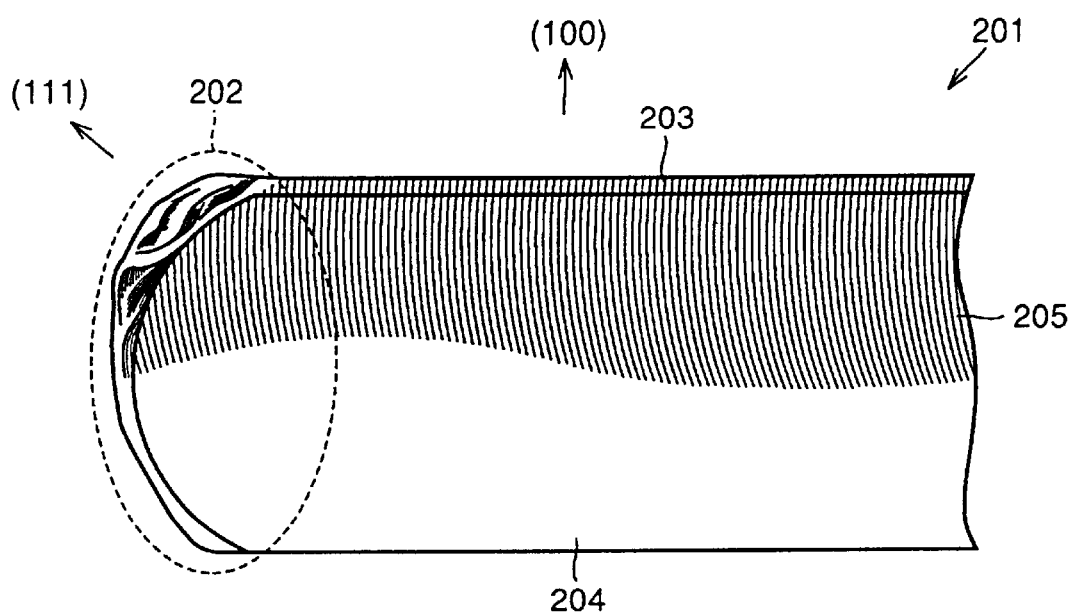
FIG. 8 is a cleavage sectional view of a conventional wafer.

Referring to FIG. 7, it is understood that a wafer 101 according to the present invention is formed by a substrate 104 and an epitaxial layer 103, and an abnormal grown part can be removed from an outer peripheral portion 102 of the wafer 101. It is also understood that no linear flaws are caused on the inventive wafer 101 shown in FIG. 7 having no distortion on the outer peripheral portion 102. Referring to FIG. 8, on the other hand, it is understood that a wafer 201 having an unremoved abnormal grown Part is formed by a substrate 204 and an epitaxial layer 203, and a number of linear flaws 205 are caused by distortion of its outer peripheral portion 202. In this wafer 201, further, the thickness of the epitaxial layer 203 is about three times in the abnormal grown part as compared with the flat part. Also from this, it is understood that distortion in the peripheral portion of the wafer 101 is effectively eliminated in the present invention due to the removal of the abnormal grown part.

While an Example of the present invention has been des-cribied above, this Example can be modified in various ways. The diameter of the substrate 22 prepared first was set at 51 mm, in order to prevent such a problem that the apparatus may fail to grasp the wafer 21 in a device process step which is set for 50 mm if the diameter of the substrate 22 is smaller than 50 mm. If the wafer 21 is carried by handling, therefore, its diameter may not be 51 mm.

While the chloride VPE employed for epitaxy is advantageous for a product such as a pin-PD requiring a relatively thick epitaxial layer in the point that this method can grow the epitaxial layer at a high speed, the epitaxial layer may alternatively be prepared by organic metal vapor-phase epitaxy if a thick epitaxial layer is not required. Further, the present invention is applicable to all epitaxy methods having plane orientation dependency of the epitaxial layer growing rate such as a hydride method and an organic metal method.

In order to chamfer the wafer, it is preferable to use an integrated grindstone having two types of grain sizes for improving the working accuracy. While the grindstone comes into contact with the epitaxial layer for removing the end portion of the wafer, the epitaxial layer is preferably cleaned after coming into contact with the grindstone. Alternatively, the remaining portion of the epitaxial layer may be protected with a resist film or a tape, which is removed after the end portion has been removed by grinding. Further, the substrate may be prepared not only from InP but also from another group III-V compound having the same crystal structure.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a group III-V compound semiconductor wafer, comprising the following steps:

a) providing a semiconductor substrate that comprises a first group III-V semiconductor compound and that has a flat major surface and a substrate peripheral edge having an arcuate sectional shape with an initial radius of curvature R;

b) providing on said semiconductor substrate, a group III-V compound layer comprising a second group III-V semiconductor compound having a different composition than said first group III-V compound, so as to prepare a raw wafer including said layer on said substrate and having a raw wafer peripheral edge; and c) removing a portion of said raw wafer extending from said raw wafer peripheral edge radially inwardly toward a center of said wafer by a removal distance L, wherein said removal distance L is from 1 to 3 times said initial radius of curvature R ($R \leq L \leq 3R$), so as to form a processed wafer having a processed wafer peripheral edge.

2. The method according to claim 1, wherein said step b) of providing said layer comprises forming said layer on said substrate such that an abnormally formed layer portion of said layer is formed on said substrate peripheral edge, and said step c) of removing said portion of said wafer includes entirely removing said abnormally formed layer portion so that said processed wafer does not include any of said abnormally formed layer portion.

3. The method according to claim 2, wherein said forming of said layer comprises epitaxially growing said layer such that said abnormally formed layer portion is an epitaxially abnormally grown portion.

4. The method according to claim 3, wherein said growing of said layer includes epitaxially growing said epitaxially abnormally grown portion along (111) crystallographic planes of said second group III-V semiconductor compound, and growing (100) crystallographic planes substantially parallel to said flat major surface.

5. The method according to claim 2, wherein said abnormally formed layer portion is so formed to have an abnormally greater thickness than a remainder of said layer other than said abnormally formed layer portion.

6. The method according to claim 1, wherein said layer consists essentially of InGaAs and said substrate consists essentially of InP.

7. The method according to claim 1, wherein said step c) is carried out such that said processed wafer peripheral edge has a surface roughness Rmax of not more than 2 $\mu$m.

8. The method according to claim 1, wherein said step c) is carried out such that said substrate is exposed by entirely removing said layer at said processed wafer peripheral edge.

9. The method according to claim 8, wherein said step c) further includes removing some of said substrate at said substrate peripheral edge, and leaving an exposed portion of said substrate protruding radially outwardly beyond said layer by at least 0.1 mm.

10. The method according to claim 1, wherein said step c) is carried out such that said processed wafer peripheral edge has an arcuate sectional shape with a radius of curvature of at least 0.1 mm.

11. The method according to claim 10, wherein said step c) is carried out such that said arcuate sectional shape of said processed wafer peripheral edge is defined by a single continuous smooth curvature of respective edges of said substrate and of said layer.

12. The method according to claim 1, wherein said step c) comprises plural successive grinding steps using plural grindstones respectively having successively finer grits and successively reduced radii of curvature of concave grinding surfaces of said grindstones so as to shape said processed wafer peripheral edge to successively smaller radii of curvature.

13. The method according to claim 1, wherein said steps a) and b) are carried out so that said first group III-V semiconductor compound and said second group III-V semiconductor compound respectively have different thermal expansion coefficients.

14. The method according to claim 1, wherein said steps a) and b) are carried out so that said first group III-V semiconductor compound and said second group III-V semiconductor compound respectively have different lattice constants at least along said substrate peripheral edge at said raw wafer peripheral edge.

15. The method according to claim 1, further comprising a step of subjecting said processed wafer to thermal cycling in a further device process.

16. The method according to claim 1, wherein said step a) is carried out so that a (100) crystal plane of said first group III-V semiconductor compound is substantially parallel to said flat major surface of said substrate.

* * * * *

UNITED STATES PATENT AND TRADEMARK OFFICE
CERTIFICATE OF CORRECTION

PATENT NO.   : 6,294,019 B1
DATED        : September 25, 2001
INVENTOR(S)  : Miura et al.

It is certified that error appears in the above-identified patent and that said Letters Patent is hereby corrected as shown below:

Column 1,
Line 66, before "to", replace "ac-cording" by -- according --;

Column 4,
Line 61, replace "$In + HCl \rightarrow InCl + \frac{1}{2} H_2$" by -- $In + HCl \rightarrow InCl + \frac{1}{2} H_2$ --.

Column 5,
Line 1, replace "$InCl + \frac{1}{4}P_4 + \frac{1}{2} H_2 \rightarrow InP + HCl$" by -- $InCl + \frac{1}{4}P_4 + \frac{1}{2} H_2 \rightarrow InP + HCl$ --;
Line 34, replace "$Incl + GaCl + \frac{1}{4}As_4 + H_2 \rightarrow InGaAs + 2HCl$" by -- $InCl + GaCl + \frac{1}{4}As_4 + H_2 \rightarrow InGaAs + 2HCl$ --;
Line 52, before "at", replace "Dortion" by -- portion --;

Column 6,
Line 23, before "above,", replace "des-cribied" by -- described --.

Signed and Sealed this

Fifth Day of March, 2002

*Attest:*

*Attesting Officer*

JAMES E. ROGAN
*Director of the United States Patent and Trademark Office*